United States Patent
Suh et al.

(10) Patent No.: US 7,939,391 B2
(45) Date of Patent: May 10, 2011

(54) III-NITRIDE DEVICES WITH RECESSED GATES

(75) Inventors: Chang Soo Suh, Goleta, CA (US); Ilan Ben-Yaacov, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 12/816,971

(22) Filed: Jun. 16, 2010

(65) Prior Publication Data

US 2010/0255646 A1  Oct. 7, 2010

Related U.S. Application Data

(62) Division of application No. 12/102,340, filed on Apr. 14, 2008, now Pat. No. 7,795,642.

(60) Provisional application No. 60/972,481, filed on Sep. 14, 2007.

(51) Int. Cl.
  *H01L 21/338* (2006.01)
(52) U.S. Cl. .......... 438/172; 257/194; 257/76; 257/268; 257/E29.249; 257/E21.403
(58) Field of Classification Search .......... 438/172; 257/194, 76, 268, E29.249, E21.403
See application file for complete search history.

(56) References Cited

U.S. PATENT DOCUMENTS

| | | | |
|---|---|---|---|
| 2002/0121648 A1 | 9/2002 | Hsu et al. | |
| 2005/0189561 A1 | 9/2005 | Kinzer et al. | |
| 2006/0124962 A1* | 6/2006 | Ueda et al. ..................... | 257/192 |
| 2006/0186422 A1 | 8/2006 | Gaska et al. | |
| 2006/0189109 A1* | 8/2006 | Fitzgerald ..................... | 438/586 |
| 2006/0289901 A1 | 12/2006 | Sheppard et al. | |
| 2007/0018199 A1 | 1/2007 | Sheppard et al. | |
| 2007/0128743 A1* | 6/2007 | Huang et al. ..................... | 438/21 |
| 2007/0164315 A1* | 7/2007 | Smith et al. ..................... | 257/194 |
| 2007/0194354 A1 | 8/2007 | Wu et al. | |
| 2009/0032820 A1 | 2/2009 | Chen | |
| 2009/0065810 A1 | 3/2009 | Honea et al. | |

OTHER PUBLICATIONS

Lee, Chung Keun, International Search Report and Written Opinion of the International Search Authority in International Application Serial No. PCT/US2008/076030, Mar. 23, 2009, 10 pages.
V. Kumar et al., "High transconductance enhancement-mode AlGaN/GaN HEMTs on SiC Substrate", Nov. 27, 2003, *Electronics Letters*, vol. 39, No. 24, 2 pages. Online No. 20031124.
W. B. Lanford et al., "Recessed-gate enhancement-mode GaN HEMT with high threshold voltage", Mar. 31, 2005, *Electronics Letters*, vol. 41, No. 7, 2 pages. Online No. 20050161.
Wataru Saito et al., "Recess-Gate Structure Approach Toward Normally Off High-Voltage AlGaN/GaN HEMT for Power Electronics Applications", Feb. 2006, *IEEE Transactions on Electron Device*, vol. 53, No. 2, pp. 356-362.
Cussac, Yolaine, International Preliminary Report on Patentability in International Application Serial No. PCT/US2008/076030, Mar. 16, 2010, 5 pages.

* cited by examiner

*Primary Examiner* — Tu-Tu V Ho
(74) *Attorney, Agent, or Firm* — Fish & Richardson P.C.

(57) ABSTRACT

III-nitride devices are described with recessed gates. In some embodiments, the material around the gates is formed by epitaxially depositing different III-nitride layers on a substrate and etching through at least the top two layers in the gate region. Because adjacent layers in the top three layers of the structure have different compositions, some of the layers act as etch stops to allow for precision etching. In some embodiments, a regrowth mask is used to prevent growth of material in the gate region. A gate electrode is deposited in the recess.

18 Claims, 10 Drawing Sheets

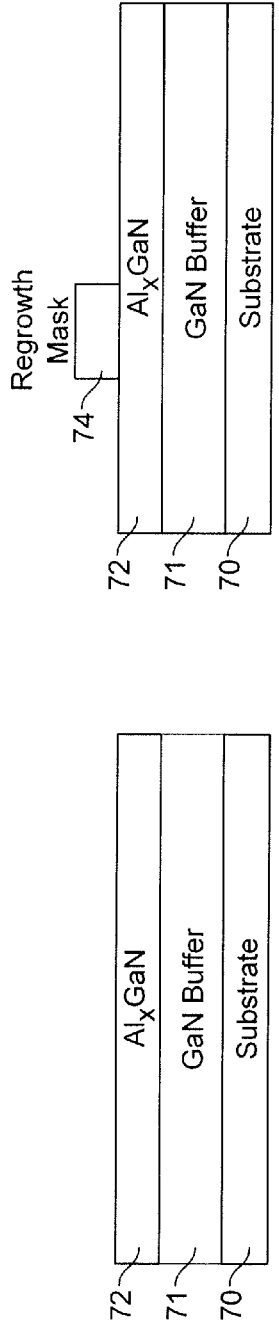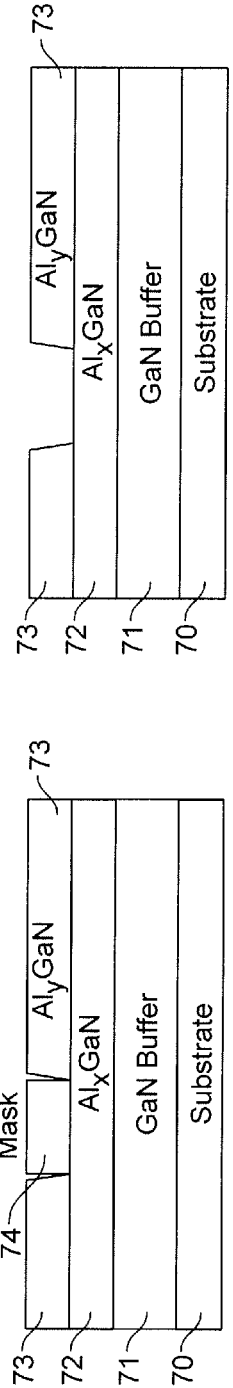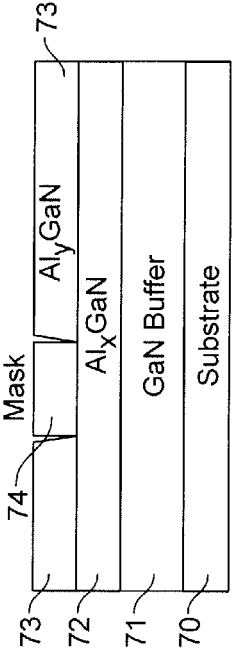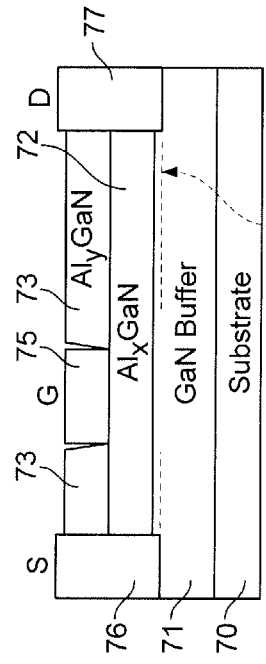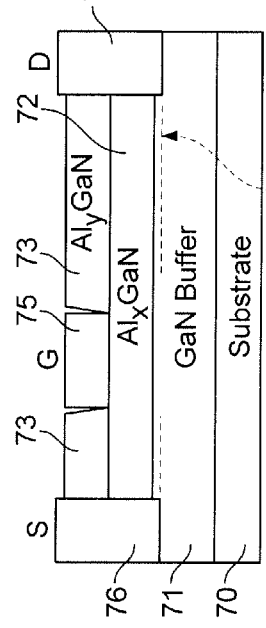

III-NITRIDE DEVICES WITH RECESSED GATES

CROSS-REFERENCE TO RELATED APPLICATIONS

This application is a divisional application of U.S. patent application Ser. No. 12/102,340, filed Apr. 14, 2008, which claims the benefit of U.S. Provisional Application No. 60/972,481, filed on Sep. 14, 2007. The entire disclosures of the prior applications are incorporated herein by reference.

TECHNICAL FIELD

This invention relates to enhancement mode III-nitride devices.

BACKGROUND

To date, modern power semiconductor devices including devices such as Si Power MOSFETs and Si Insulated Gate Bipolar Transistors (IGBT) have been typically fabricated with silicon (Si) semiconductor materials. More recently, silicon carbide (SiC) power devices have been researched due to their superior properties. Gallium Nitride (GaN) semiconductor devices are now emerging as an attractive candidate to carry large currents and support high voltages providing very low on resistance and fast switching times. Standard GaN high electron mobility transistor (HEMTs) and related devices are typically normally on, which means that they conduct current at 0 gate voltage.

FIG. 1 shows a standard Ga-face GaN HEMT structure. Substrate 10 may be GaN, SiC, sapphire, Si, or any other suitable substrate for GaN device technology. GaN layer 14 and $Al_xGa_{1-x}N$ layer 18 are oriented in the [0 0 0 1] (C-plane) direction. The conducting channel consists of a two-dimensional electron gas (2 DEG) formed in the GaN layer 14 near the $Al_xGa_{1-x}N$/GaN interface. The region between the source and gate is referred to as the source access region, and the region between the drain and gate is referred to as the drain access region. This device is normally on or is a depletion mode device. At 0 gate voltage, the 2 DEG channel extends from the source to the drain contact, and the device is in the ON state. A negative gate voltage must be applied to deplete the 2 DEG under the gate and thus turn the device OFF.

$Al_xGa_{1-x}N$ layer 18 is formed with at least a minimum thickness in order to induce the 2 DEG channel. This minimum thickness depends on the Al composition in the AlGaN; lower Al composition increases the minimum thickness. FIG. 2 shows the 2 DEG sheet charge density $n_s$ versus AlGaN thickness for a number of different Al compositions in structures with and without an AlN layer. For thicknesses above the minimum thickness, $n_s$ at first increases with thickness but eventually levels out. For structures in which the AlGaN thickness is less than the minimum thickness, applying a large enough positive gate voltage will induce a 2 DEG underneath the gate, but not in the access regions. The sheet charge density $n_s$ in this 2 DEG increases as the gate voltage is further increased.

It is desirable in power electronics to have normally off devices that do not conduct at 0 gate voltage to avoid damage to the device or other circuit components by preventing any accidental turn on of the device. A desirable enhancement-mode (E-mode) GaN HEMT has two features. The source and drain access regions contain a 2 DEG with conductivity at least as large as the conductivity of the channel region when the device is in the ON state. Preferably, the conductivity of the access regions is as large as possible, since this reduces the access resistance, thus reducing the ON-resistance $R_{on}$. Also, the channel region underneath the gate should have no 2 DEG at 0 gate voltage. A positive gate voltage is therefore required to induce a 2 DEG in this region and thus turn the device ON.

Further methods and devices that improve an e-mode GaN HEMT access region conductivity while maintaining a gate region with no 2 DEG at 0 gate voltage are desirable.

SUMMARY

In some aspects, an enhancement mode III-nitride device is described. The device has a first layer of GaN on a substrate; a layer of $Al_xGaN$ on the layer of GaN; a second layer of GaN in an access region of the layer of AlxGaN, wherein the second layer of GaN is not in a gate region of the layer of $Al_xGaN$ and the second layer of GaN is free of aluminum; a layer of $Al_yGaN$ on the second layer of GaN; and a gate electrode on the gate region and a source and a drain, wherein a region between the source and the gate region and a region between the drain and the gate region is the access region.

Embodiments of the device can include one or more of the following features. The layer of $Al_xGaN$ can be a p-type layer and the device can further include a layer of AlN between the first layer of GaN and the layer of $Al_xGaN$. The device can include a field plate connected to either the gate electrode or source.

In some aspects, a method of forming an enhancement mode III-nitride device is described. The first layer of GaN, the layer of $Al_xGaN$, the second layer of GaN and a layer of $Al_yGaN$ are formed on the substrate. The source and the drain are formed. A recess is etched in the layer of $Al_yGaN$ and partially through the second layer of GaN. A recess is etched in a remaining portion of the second layer of GaN, wherein the recess exposes the layer of $Al_xGaN$. The gate electrode is formed in the recess. Optionally, etching a recess in a remaining portion can include changing an etch chemistry.

In another aspect, a method of forming an enhancement mode III-nitride device is described. The first layer of GaN, the layer of $Al_xGaN$, and the second layer of GaN is formed on a substrate. A recess is etched in the second layer of GaN, wherein the recess exposes the layer of $Al_xGaN$. A regrowth mask is formed over the exposed layer of $Al_xGaN$. The layer of $Al_yGaN$ on top is formed of the second layer of GaN. The source and the drain are formed. The gate electrode is formed in the recess. Optionally, the regrowth mask is removed prior to forming the gate electrode.

In yet another aspect, a method of forming an enhancement mode III-nitride device is described. A layer of GaN is formed on a substrate. A first portion of a layer of AlGaN is formed on the layer of GaN. A regrowth mask is formed over the gate region of the first portion of the layer of AlGaN. A second portion of the layer of AlGaN is formed in an access region of the device. A gate electrode is formed in a gate region of the device. A source and a drain are formed outside of the gate region and defining in part the access region.

Embodiments of the methods can include one or more of the following features or steps. The regrowth mask can be removed. The regrowth mask can be one of aluminum nitride, silicon nitride or silicon oxide. The method can include doping the second portion of the layer of AlGaN. The first portion of the layer of AlGaN can be $Al_xGa_{1-x}N$ and the second portion of the layer of AlGaN can be $Al_yGa_{1-y}N$, where x≠y. X can be greater than y. A top surface of the gate region can have a flatness within 2 nanometers. The layer of AlGaN can have a uniform composition throughout a thickness of the layer. Forming the layer of AlGaN controls a thickness of the layer of AlGaN to within 2 nanometers. The layer of AlGaN can be doped. The layer of AlGaN can be doped with iron. An insulating region can be formed between the gate electrode and the layer of AlGaN. Forming a first portion of a layer of AlGaN can include epitaxially growing AlGaN.

In an E-mode device, the threshold voltage $V_{th}$ must be greater than 0 V, preferably 2-3 volts for power semiconductor device applications, and it is desirable to have a high conductivity in the source and drain access regions. For a given AlGaN thickness under the gate, one way to increase the threshold voltage of the device is by using p-type AlGaN. To increase $n_s$ in the access regions, several surface treatments can be employed. Several E-mode GaN HEMT structures are described that can be readily fabricated using existing technology, some of which involve using p-type AlGaN. Fabrication methods are provided for each structure. Some of the devices include a GaN interlayer within an AlGaN cap. This allows for the use of etch-stop technology to fabricate devices in which material underneath the gate is etched, so that the etch depth can be accurately controlled and is uniform to within a few nanometers. For devices with a GaN interlayer in which the access region is regrown, the regrowth can be performed directly on a GaN layer. This can be preferable to regrowth directly on AlGaN, since regrowing high quality material directly on AlGaN has proven to be somewhat difficult.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 4a-d show the steps in the fabrication of the device of FIG. 4e.

FIG. 4e is a schematic representation of a III-nitride type transistor.

FIG. 5b is a band diagram under the gate of the device of FIG. 5a.

FIG. 6b is a band diagram along the dotted vertical line in the access region of the device of FIG. 6a.

FIG. 6c is a band diagram along the dotted vertical line in the access region of the device of FIG. 6a.

FIGS. 7a-d show the steps in the fabrication of the device of FIG. 5a.

FIGS. 8a-f show the steps in the fabrication of the device of FIG. 5a.

FIG. 9b is a band diagram under the gate of the device of FIG. 9a.

FIG. 10b is a band diagram along the dotted vertical line in the access region of the device of FIG. 10a.

FIG. 10c is a band diagram along the dotted vertical line in the access region of the device of FIG. 10a.

Several embodiments to achieve E-mode GaN HEMTs are described. For each structure, descriptions of various fabrication methods are also included. In describing the structures, regular use of semiconductor energy band diagrams is made, along with device schematics. In all the device schematics, the 2 DEG which is the electron channel or the conducting channel in a HEMT device is indicated by dashed lines.

Like reference symbols in the various drawings indicate like elements.

DETAILED DESCRIPTION

The devices described herein have a gate recess formed in upper layers of the device to aid in forming a normally off device, that is, a device with a threshold voltage that is greater than 0 V. The gate, which is then located in the recess, is over at least one layer of GaN and a layer of AlGaN and is surrounded by AlGaN material or both AlGaN and GaN material. Such structures can provide both the desired threshold voltage and conductivity in the access regions.

Figure 1:
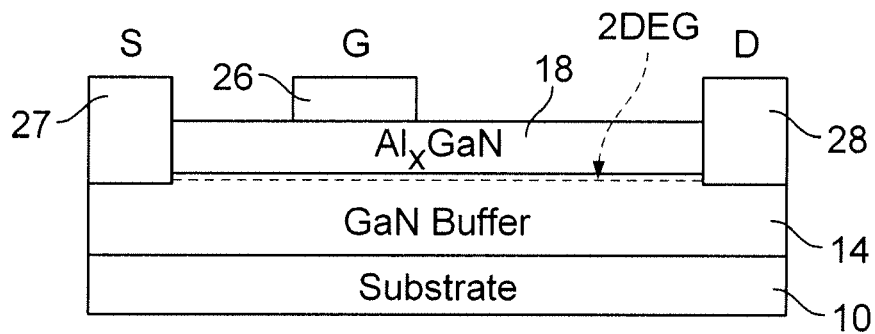
FIG. 1 is a schematic representation of a III-nitride type transistor.
Figure 3:
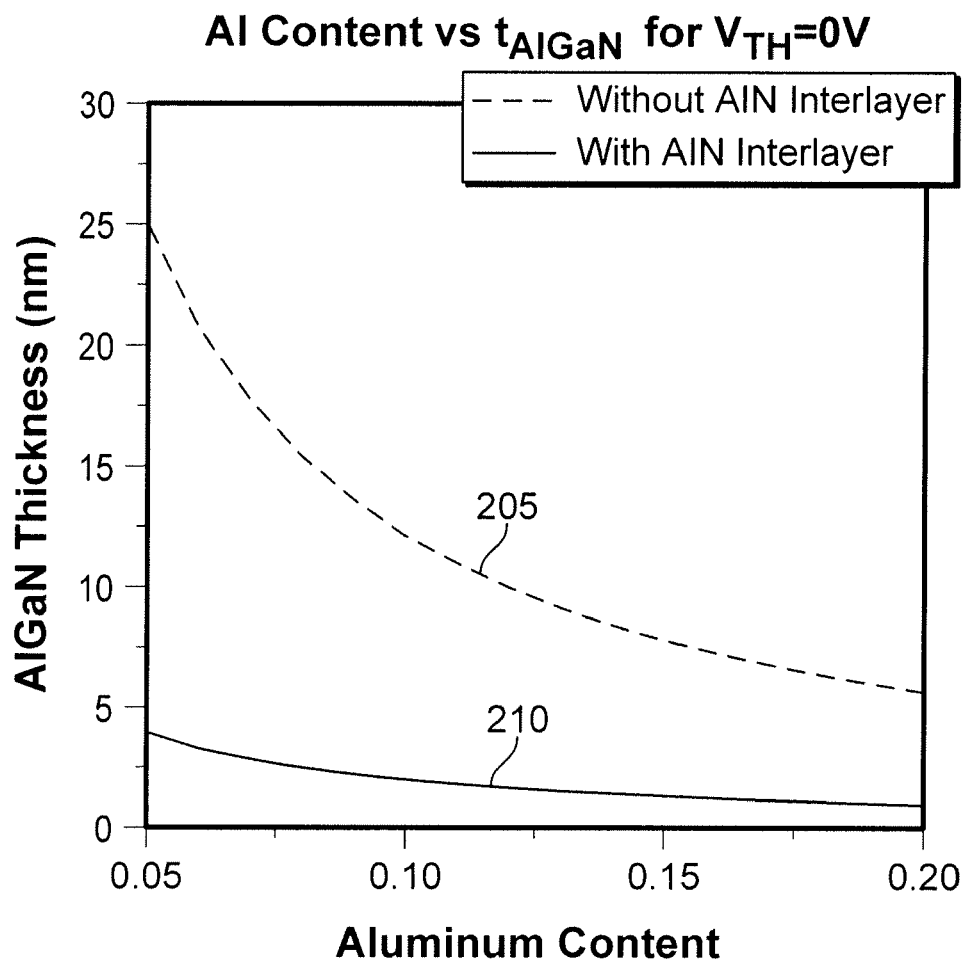
FIG. 3 shows a graph of aluminum content in a layer of AlGaN versus the required AlGaN thickness in nm for the threshold voltage under the gate to be 0 V.
Figures 2A, 2B:
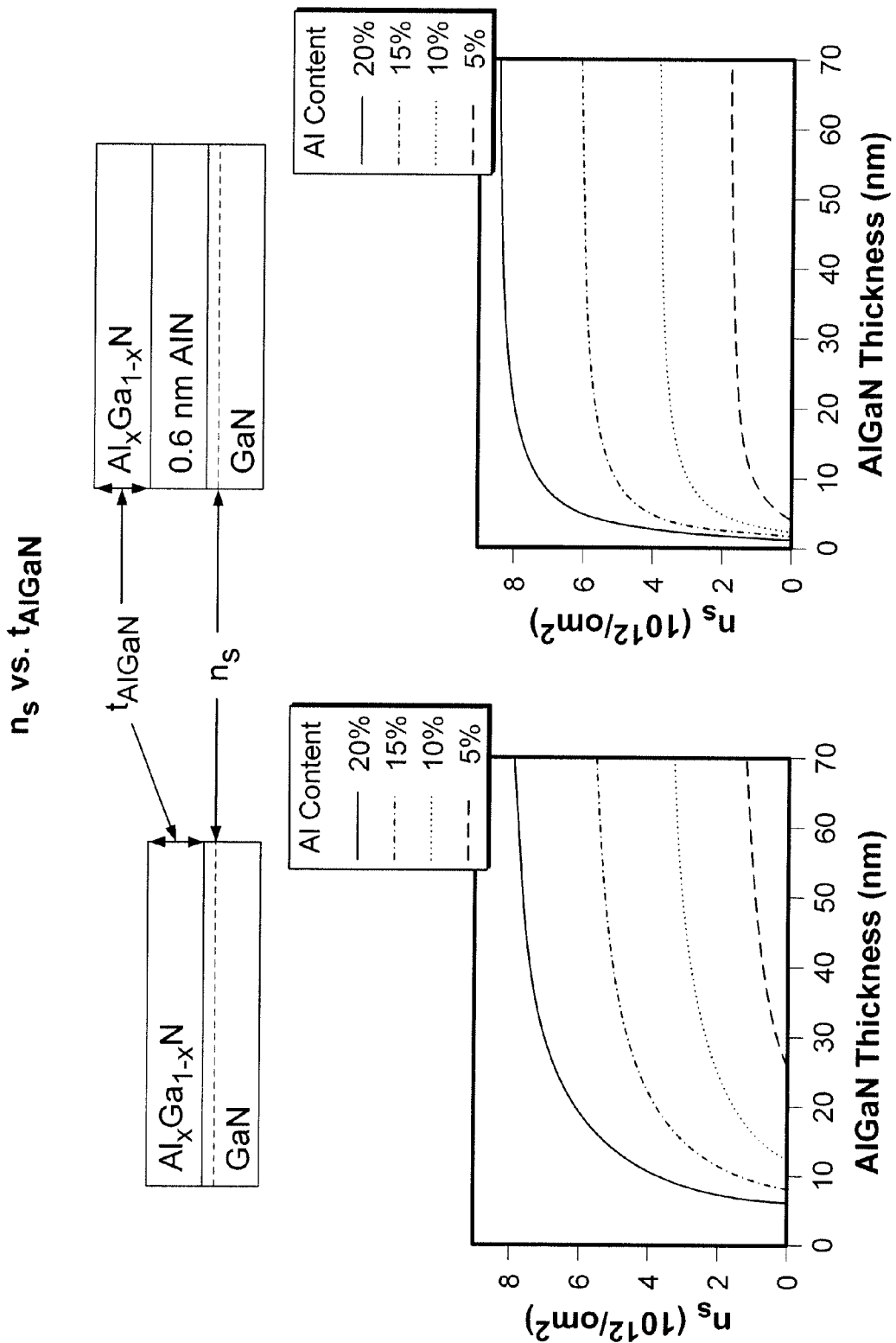
FIG. 2a-b shows 2 DEG sheet charge density $n_s$ versus AlGaN thickness for different aluminum compositions in two different structures.

The devices can optionally include an AlN interlayer. For the structures shown in FIG. 2, the $Al_xGaN$ thickness underneath the gate electrode versus Al composition to form devices with $V_{th}=0$ is plotted in FIG. 3. Line 205 corresponds to devices without an AlN interlayer, such as the device in FIG. 2a, and line 210 corresponds to devices which contain a 0.6 nm AlN interlayer, such as the device in FIG. 2b. As shown in FIG. 3, if $Al_{0.2}GaN$ is used to build an E-mode device, the $Al_xGaN$ thickness in the gate region is about 5 nm or less if no AlN layer is included, and 1 nm or less if an AlN layer is included.

Referring to FIG. 4e, substrate 70 is formed of GaN, SiC, sapphire, Si, or any other suitable substrate for GaN device technology. On the substrate 70 is formed a GaN layer 71, an $Al_xGaN$ layer 72, and an $Al_yGaN$ layer 73. The Al composition in AlGaN layers, $Al_xGaN$ layer 72 and $Al_yGaN$ layer 73, can be but need not be the same. A higher Al composition in $Al_xGaN$ layer 72 results in a larger 2 DEG sheet charge density in the access regions. However, for a larger Al composition in layer 72, the layer must also be made thinner to insure $V_{th}>0$. That is, $V_{th}$ increases with decreasing Al composition and with decreasing layer thickness. For example, in some devices if the Al composition is 0.2, $Al_xGaN$ layer 72 must be 5 nm thick or less. The exact value of $V_{th}$ is determined by both the Al composition and thickness of $Al_xGaN$ layer 72. When 0 gate voltage is applied to the device in FIG. 4e, it is OFF. When a large enough gate voltage is applied to induce a 2 DEG under the gate, the device is ON.

Referring to FIGS. 4a-4e, process steps for forming the device in FIG. 4e are shown. First, GaN layer 71 and $Al_xGaN$ layer 72 are grown on substrate 70 (FIG. 4a). Next, as shown in FIG. 4b, a regrowth mask 74 is deposited over the gate region. The regrowth mask material may be AlN, SiN, $SiO_2$, or any other suitable masking material for regrowth of GaN and AlGaN. Next, $Al_yGaN$ layer 73 is selectively regrown in the access regions, as illustrated in FIG. 4c. In regrowth of GaN or AlGaN, the regrown material is typically unintentionally doped n-type material, which may be undesirable in this process. For the case where n-type doping is undesirable, the n-type dopant can be compensated, such as by doping the regrown material with Fe. Finally, regrowth mask 74 is removed (FIG. 4d), source and drain ohmic contacts 76 and 77 are formed, after which the gate metal 78 is deposited, resulting in the device in FIG. 4e. This process, by which the thickness of the AlGaN layer under the gate is determined by the thickness to which layer 72 is grown epitaxially, is much more controllable and reproducible than one in which a recess etch is used in the gate region. In some embodiments, the regrowth mask is not removed, but rather is left in place before formation of the gate electrode, such as to form a gate insulator.

In the fabrication process shown in FIGS. 4a-e, because AlGaN layer 72 is epitaxially grown to its final desired thickness, a high degree of epitaxial thickness control, such as within about 2 nm of a desired thickness, such as within 1 nm of a desired thickness, and surface flatness, such as a flatness of less than about 2 nm or less than 1 nm can be achieved. This is much more uniform and provides a much higher degree of thickness control than if the device is fabricated through other methods, such as by forming layers 72 and 73 over the entire device and then etching layer 73 to its final thickness in the region where the gate is deposited. In some embodiments, the thickness uniformity in the gate region can be within 2 nanometers, such as within or less than 1 nanometer, and the thickness control of the top semiconductor layer in the gate region can be within 2 nanometers, such as within or less than 1 nanometer.

Figure 5A:
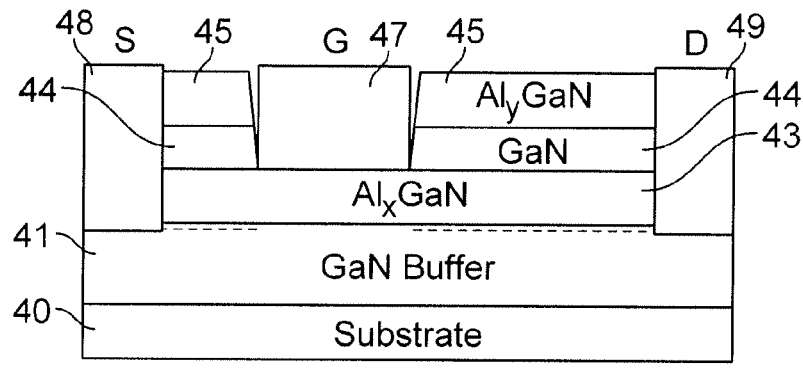
FIG. 5a is a schematic representation of a III-nitride type transistor.

Referring to FIG. 5a, substrate 40 is formed of GaN, SiC, sapphire, Si, or any other suitable substrate for GaN device technology. On the substrate 40 is formed a GaN layer 41, an $Al_xGaN$ layer 43, a GaN layer 44 and an $Al_yGaN$ layer 45. The Al composition in AlGaN layers, $Al_xGaN$ layer 43 and $Al_yGaN$ layer 45 can be but need not be the same. A higher Al composition in $Al_xGaN$ layer 43 results in a larger 2 DEG sheet charge density in the access regions. However, for a larger Al composition in layer 43, the layer must also be made thinner to insure $V_{th}>0$. That is, $V_{th}$ increases with decreasing Al composition and with decreasing layer thickness. For example, if the Al composition is 0.2, $Al_xGaN$ layer 43 must be 5 nm thick or less. The exact value of $V_{th}$ is determined by both the Al composition and thickness of $Al_xGaN$ layer 43. In embodiments, GaN layer 44 is free of aluminum.

Figure 5B:
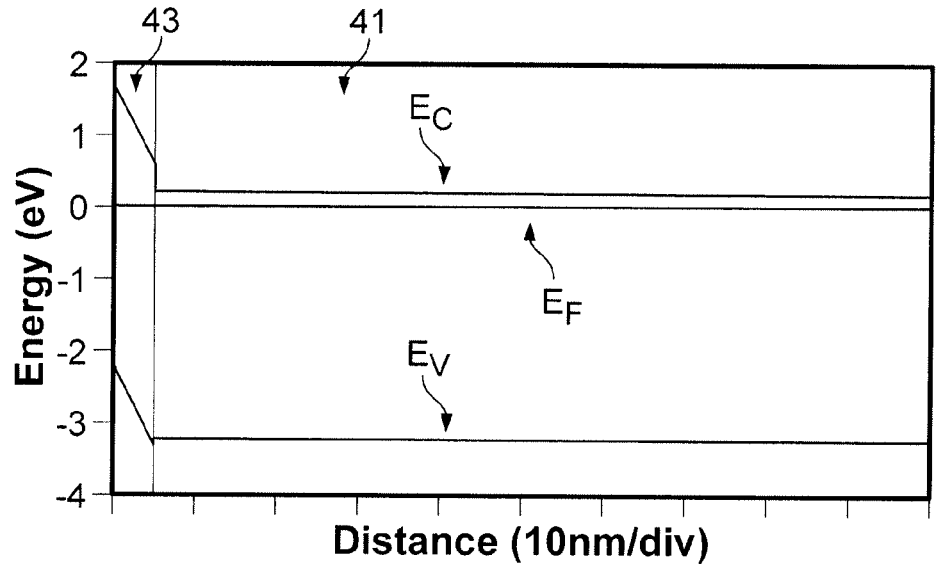

In FIG. 5b, a band diagram for the region underneath the gate of the device in FIG. 5a at 0 gate voltage, where the Al composition and thickness of layer 43 are 0.2 and 5 nm, respectively, shows that the conduction band $E_C$ remains above the Fermi level $E_F$ at the interface of $Al_xGaN$ layer 43 and GaN layer 41. Because the conduction band does not cross the Fermi level, no 2 DEG is present in the gate region and the device is OFF when no voltage is applied at the gate.

Figure 6A:
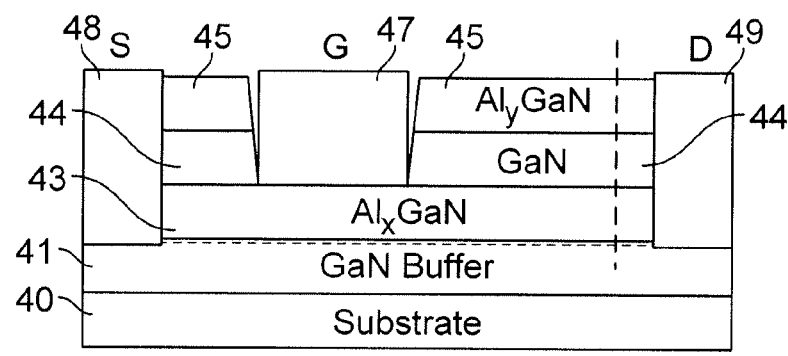
FIG. 6a is a schematic representation of a III-nitride type transistor.
Figure 6B:
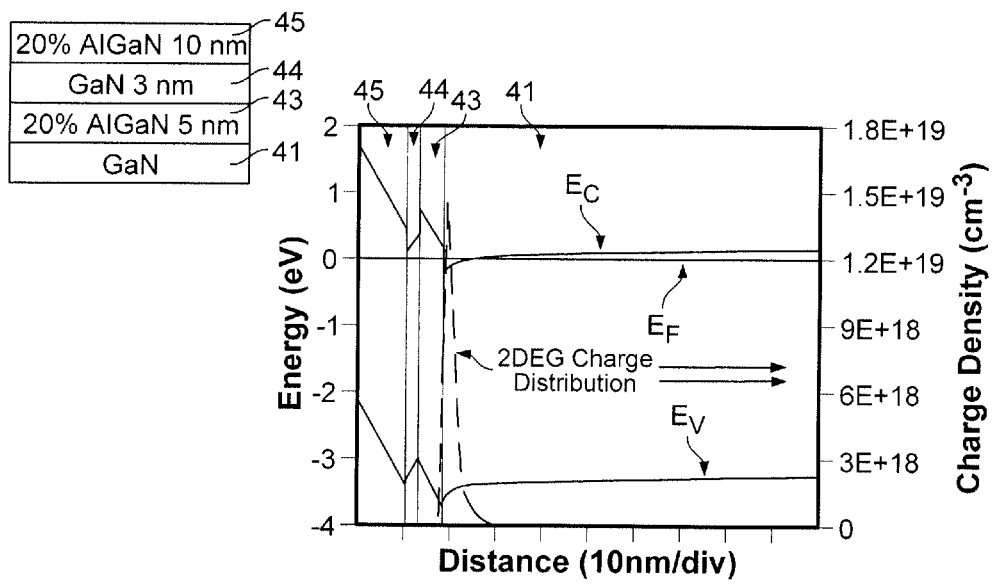
Figure 6C:
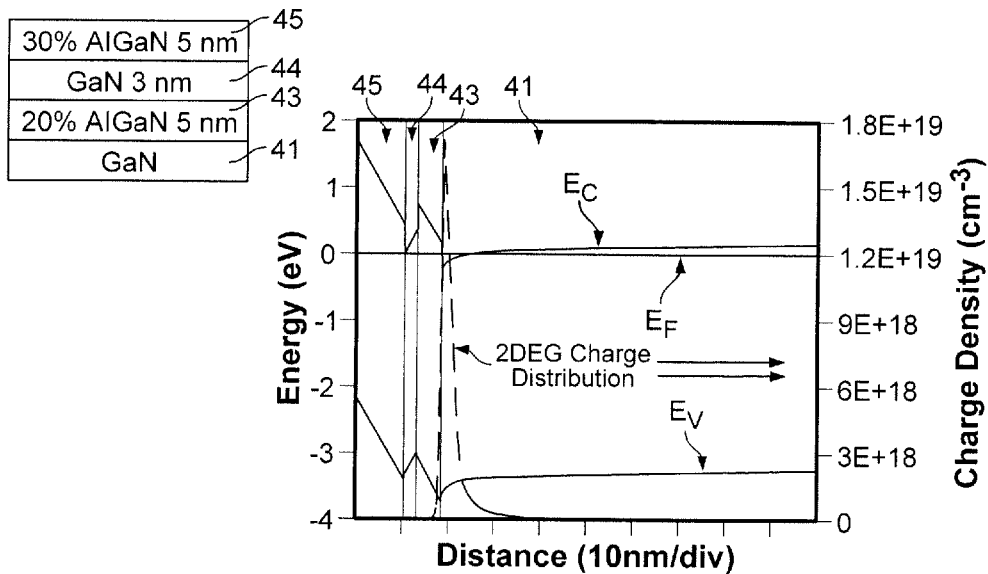

The device of FIG. 6a is similar to the device of FIG. 5a. The 2 DEG sheet charge density in the access regions is dependent on the Al composition in $Al_xGaN$ layer 43, as described above, and also on the thickness and Al composition of $Al_yGaN$ layer 45. FIGS. 6b and 6c show band diagrams and 2 DEG charge distributions in the access regions for two different aluminum compositions and thicknesses of $Al_yGaN$ layer 45. In FIG. 6b, the GaN layer 44 has a thickness of 3 nm, and y=0.2 and x=0.2 for $Al_yGaN$ layer 45 and $Al_xGaN$ layer 43. $Al_xGaN$ layer 43 has a thickness of 5 nm and $Al_yGaN$ layer 45 has a thickness of 10 nm. In FIG. 6c, the GaN layer 44 has a thickness of 3 nm, and x=0.2 and y=0.3 for $Al_xGaN$ layer 43 and $Al_yGaN$ layer 45, respectively. $Al_yGaN$ layer 45 has a thickness of 5 nm and $Al_xGaN$ layer 43 has a thickness of 5 nm. For higher Al compositions, the thickness of $Al_yGaN$ layer 45 can be reduced. For the structures in FIG. 6a-c, the structure of FIG. 6b results in a lower 2 DEG sheet charge concentration than that of 6c.

Figure 7B:
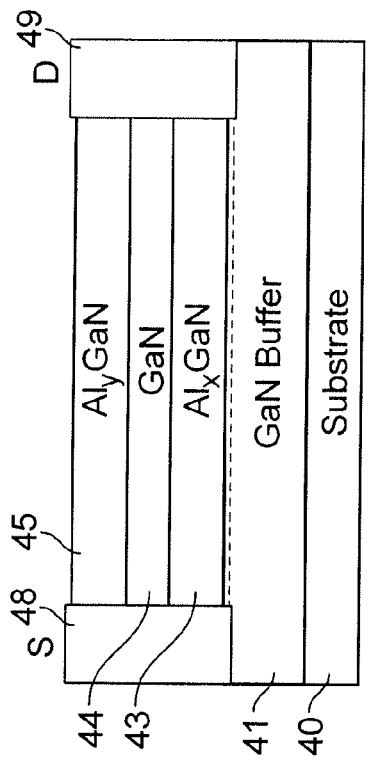
Figure 7D:
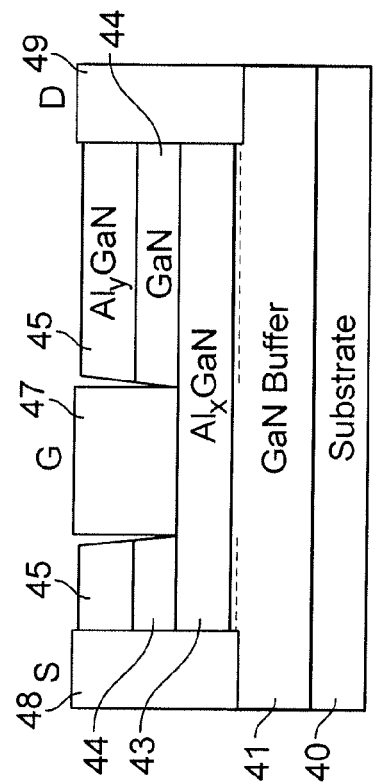
Figure 7A:
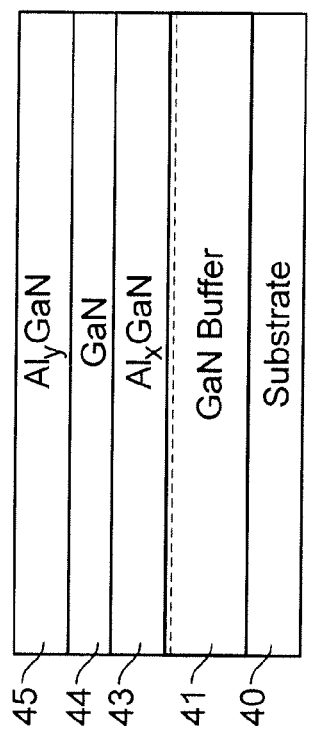
Figure 7C:
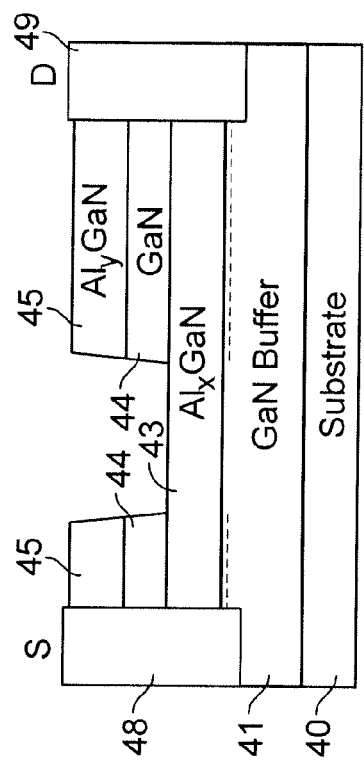

In FIGS. 7a-d, the steps in a process flow for the fabrication of the device of FIG. 5a are shown. The process shown here involves a gate recess etch. First, GaN layer 41, $Al_xGaN$ layer 43, GaN layer 44, and $Al_yGaN$ layer 45 are all grown on substrate 40, as shown in FIG. 7a. Next, as shown in FIG. 7b, source and drain ohmic contacts 48, 49 are deposited. Referring to FIG. 7c, the gate region is then etched down to $Al_xGaN$ layer 43. This is accomplished by first etching $Al_yGaN$ layer 45 and a portion of GaN layer 44 using an etch chemistry which can etch both AlGaN and GaN, such as $Cl_2$ reactive ion etching (RIE) etching. Next, the remainder of GaN layer 44 is etched using a chemistry which selectively etches GaN but not AlGaN, such as $BCl_3/SF_6$ RIE etching.

Thus, $Al_xGaN$ layer 43 serves as an etch stop layer and therefore the entire etch process may be precisely controlled. GaN layer 44 is sufficiently thick so that $Al_yGaN$ layer 45 can be etched all the way through without also etching all the way through GaN layer 44. For example, using a $Cl_2$ RIE etch, the minimum thickness for this process to be repeatable is approximately 2-3 nm. Finally, gate metal 47 is deposited, resulting in the device of FIG. 7d, which is the same as FIGS. 5a and 6a. The same photoresist layer used for the recess etch may also be used for the gate metal deposition, thus ensuring that the gate metal is self-aligned to the recessed area. In some embodiments, the source and drain ohmic contacts 48, 49 are deposited after the gate recess etch is performed.

Figure 8A:
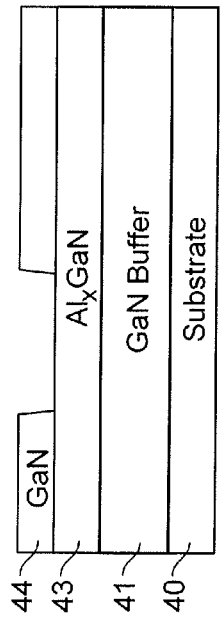
Figure 8C:
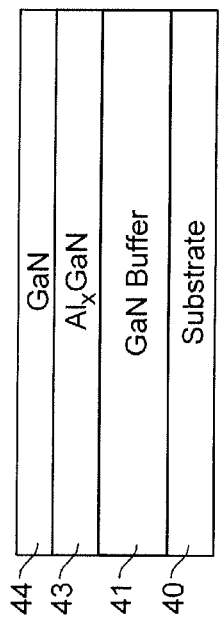
Figure 8E:
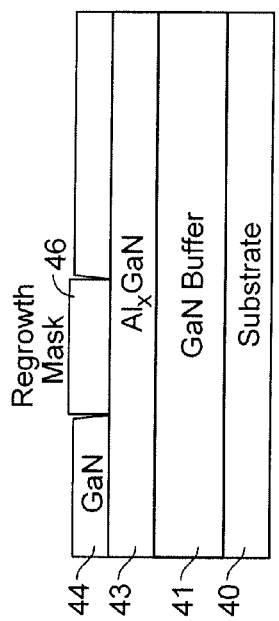
Figure 8B:
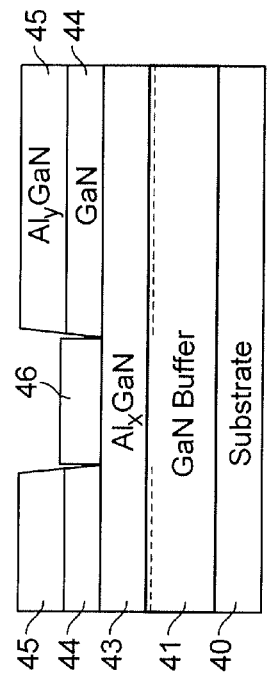
Figure 8D:
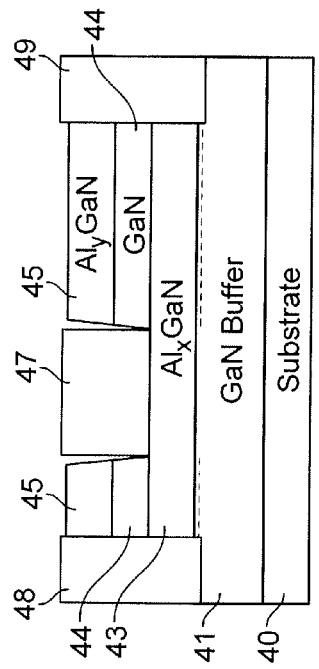
Figure 8F:
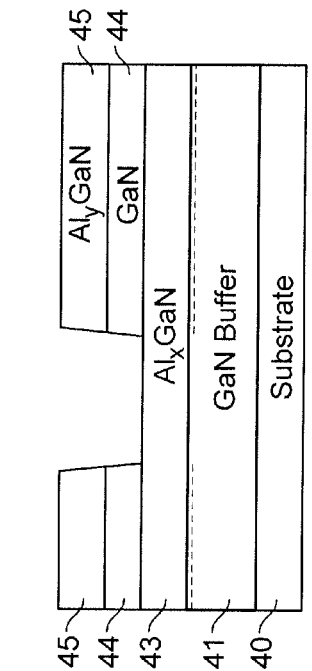

Referring to FIGS. 8a-8f, alternative process steps for forming the device in FIG. 5a are shown. First, GaN layer 41, $Al_xGaN$ layer 43, and a GaN layer 44 are grown on substrate 40 (FIG. 8a). Next, GaN layer 44 is etched in a gate region using a chemistry which selectively etches GaN but not AlGaN, such as $BCl_3/SF_6$ RIE etching (FIG. 8b). $Al_xGaN$ layer 43 serves as an etch stop layer, causing the etch to stop precisely at the interface of $Al_xGaN$ layer 43 and GaN layer 44. After etching, as shown in FIG. 8c, a regrowth mask 46 is deposited over the gate region, that is, where the $Al_xGaN$ is exposed. The regrowth mask material may be AlN, SiN, $SiO_2$, or any other suitable masking material for regrowth of GaN and AlGaN. The same photoresist layer used for the recess etch may also be used for the regrowth mask deposition, thus ensuring that the regrowth mask is self-aligned to the recessed area. Next, $Al_yGaN$ layer 45 is selectively regrown in the access regions, as illustrated in FIG. 8d. In regrowth of GaN or AlGaN, the regrown material is typically unintentionally doped n-type material, which may be undesirable in this process. For the case where n-type doping is undesirable, the n-type dopant can be compensated, such as by doping the regrown material with Fe. In this process, $Al_yGaN$ layer 45 is regrown directly on GaN. Regrowth on top of a GaN layer can be preferable to regrowth directly on AlGaN, since regrowing high quality material directly on AlGaN has proven to be somewhat difficult. Finally, regrowth mask 46 is removed (FIG. 8e), source and drain ohmic contacts 48, 49 are formed, after which the gate metal 47 is deposited, resulting in the device in FIG. 8f. In some embodiments, the regrowth mask is not removed, but rather is left in place before formation of the gate electrode, such as to form a gate insulator.

Figure 9A:
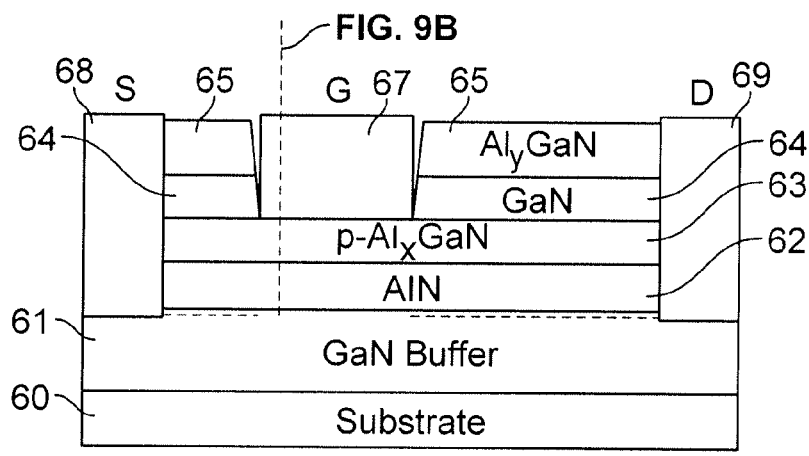
FIG. 9a is a schematic representation of a III-nitride type transistor.

Referring to FIG. 9a, a structure is shown with a p-type AlGaN layer 63 underneath the gate. The AlGaN layer 63 is doped p-type, which allows for an AlN layer 62 between AlGaN layer 63 and GaN layer 61. If AlGaN layer 63 is not doped p-type and AlN 62 is included, then AlGaN layer 63 can be formed as a very thin layer, such as less than 2 nm, to ensure normally off operation. With the use of p-AlGaN, devices containing AlN 62 can be readily designed in which the thickness of p-AlGaN in the AlGaN layer 63 is comparable to that of AlGaN 43 in FIG. 5a. GaN layer 64 and AlGaN layer 65 are formed on the AlGaN layer 63. The AlGaN layer 65 can include $Al_yGaN$ and the AlGaN layer 63 can include p-type $Al_xGaN$, where x=y, y>x or y<x.

Figure 9B:
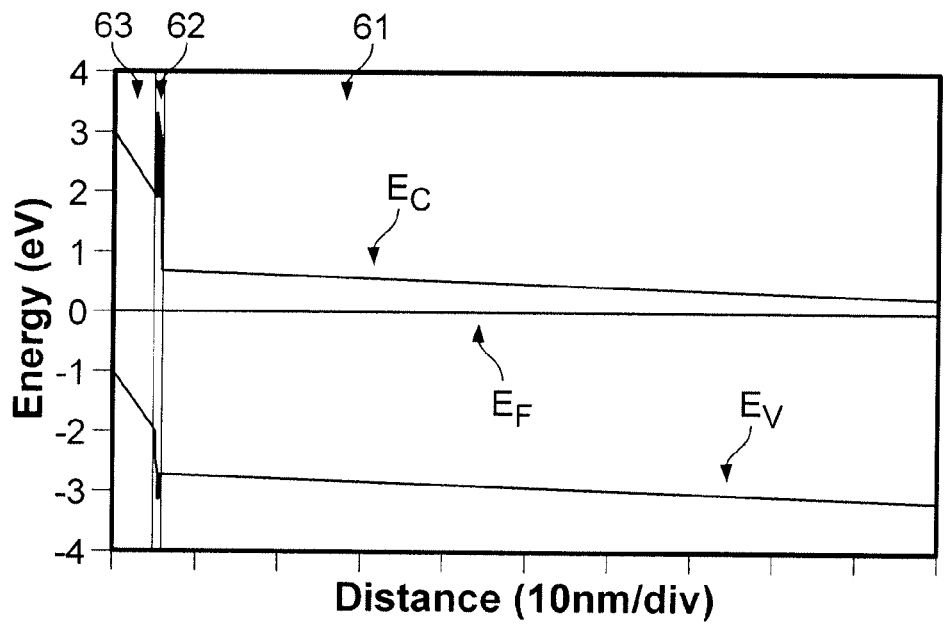

Referring to FIG. 9b, a band diagram is shown for the region underneath the gate of the device in FIG. 9a at 0 gate voltage, where the Al composition and thickness of layer 63 are 0.2 and 5 nm, respectively, and AlN layer 62 is 0.6 nm thick. The conduction band $E_C$ remains above the Fermi level $E_F$ at the interface of AlN layer 62 and GaN layer 61, indicating that no 2 DEG is present, and so the device is OFF when no voltage is applied at the gate.

Figure 10A:
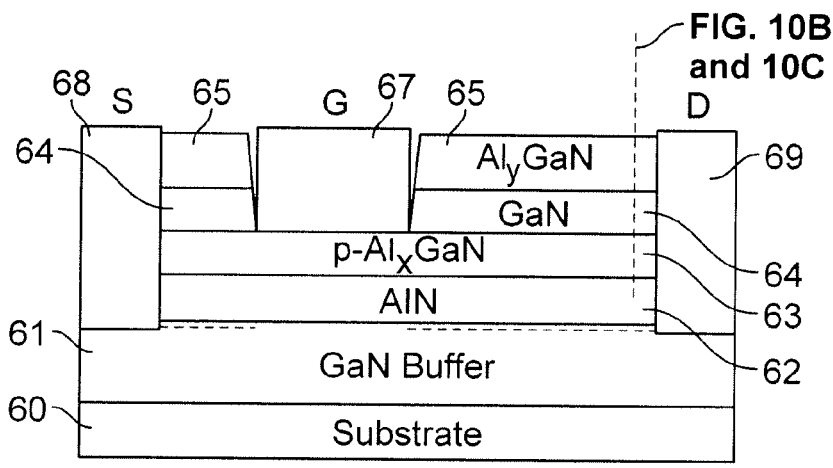
FIG. 10a is a schematic representation of a III-nitride type transistor.
Figure 10B:
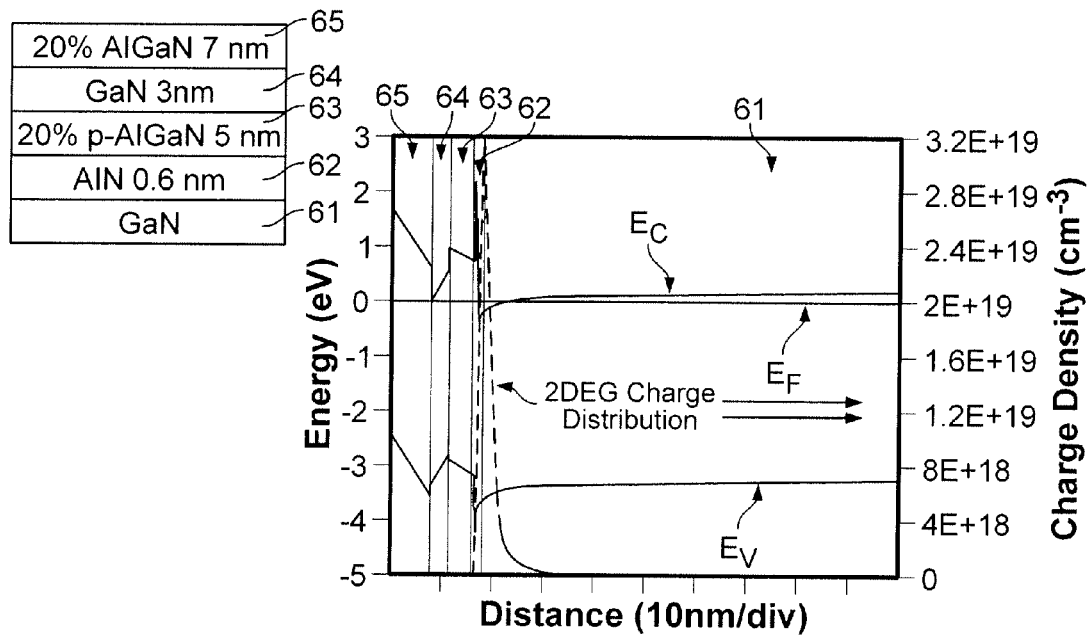
Figure 10C:
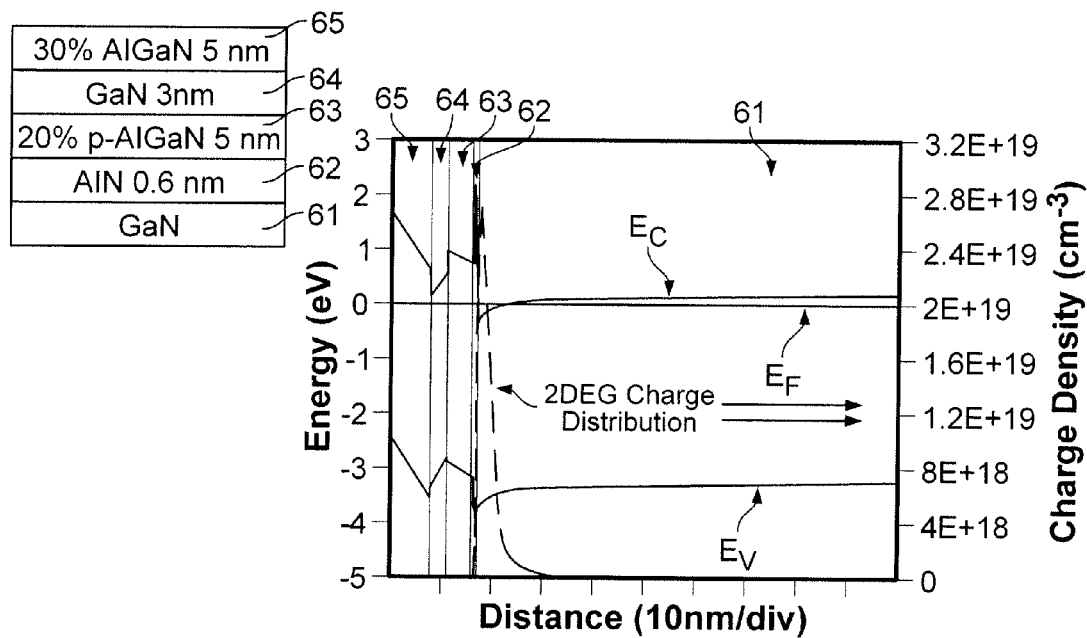

Referring to FIG. 10a, which is similar to the device in FIG. 9a, a device is formed with a p-type $Al_xGaN$ layer and an AlN layer under the gate. The 2 DEG sheet charge density in the access regions is dependent on the Al compositions and thicknesses of AlGaN layer 63 and AlGaN layer 65. FIGS. 10b and 10c show band diagrams and 2 DEG charge distributions in the access regions for two different aluminum compositions and thicknesses of layer 65. In FIG. 10b, the AlN layer 62 has a thickness of 0.6 nm, the AlGaN layer 63, which is p-type AlGaN, has a thickness of 5 nm, the GaN layer 64 has a thickness of 3 nm and the layer of AlGaN 65 has a thickness of 7 nm. If AlGaN layer 63 is formed of $Al_xGaN$ and AlGaN layer 65 is $Al_yGaN$, x=0.2 and y=0.2 for $Al_xGaN$ layer 63 and $Al_yGaN$ layer 65, respectively. In FIG. 10c, the AlN layer 62 has a thickness of 0.6 nm, the AlGaN layer 63, which is p-type AlGaN, has a thickness of 5 nm, the GaN layer 64 has a thickness of 3 nm and the layer of AlGaN 65 has a thickness of 5 nm. If AlGaN layer 63 is formed of $Al_xGaN$ and AlGaN layer 65 is $Al_yGaN$, x=0.2 and y=0.3 for AlGaN layer 63 and $Al_yGaN$ layer 65, respectively. For higher Al compositions, the thickness of layer 65 can be reduced. For the specific structures shown in FIGS. 10b and 10c, the structure of FIG. 10b results in a higher 2 DEG sheet charge concentration than that of FIG. 10c.

The fabrication procedure for the device shown in FIG. 9a or 10a can be the same as the process described in FIGS. 7a-d or the process described in FIGS. 8a-f, with the exception that during the initial growth, AlN layer 62 is also formed.

Figure 11A:
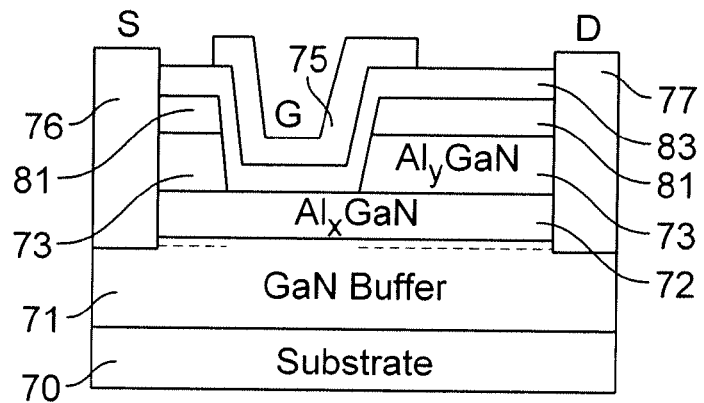
FIGS. 11a-c are schematic representations of III-nitride type transistors.
Figure 11B:
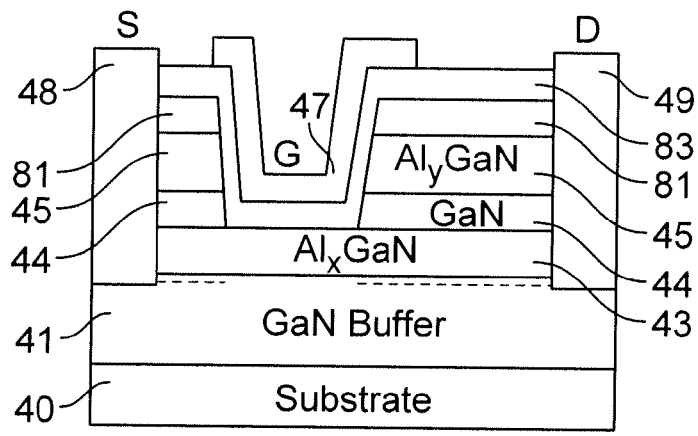
Figure 11C:
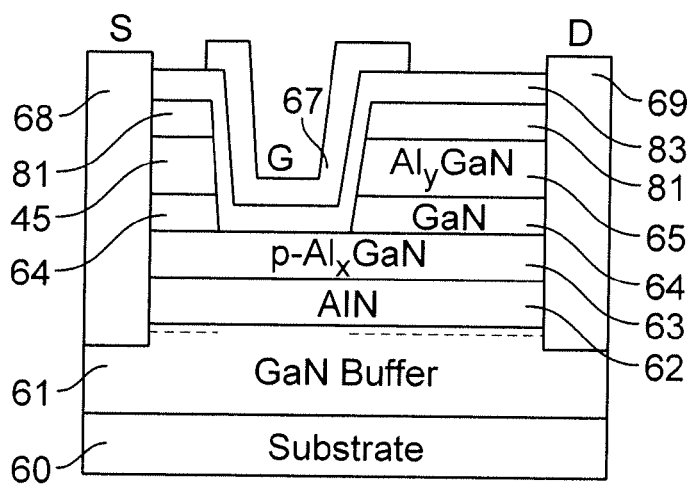

FIGS. 11a-11c illustrate some alternative implementations of the devices shown in FIGS. 4e, 5a, and 9a. These devices all include a passivation layer 81 which covers the semiconductor surface in the access regions, a gate insulator 83, and a slant field plate. The passivation layer can be any dielectric which minimizes the effect of trapped charge and ensures good device operation. In some embodiments, layer 81 is SiN. The gate insulator 83 is at least underneath the gate electrode but may extend part way or all the way towards the source and drain contacts.

Typical material growth methods for the GaN devices include but are not limited to MOCVD and MBE. Additionally, certain device structure improvements that benefit all embodiments are described. These can be applied to each of the embodiments, either together or one at a time. In some embodiments, the devices are passivated by a suitable dielectric, such as SiN. Passivation by SiN or a suitable dielectric can minimize the effect of trapped charge and ensure good device operation. In some embodiments, field plating by single or multiple field plates is included, which increase the breakdown voltage of the device and further minimizes the impact of trapping by reducing the peak electric field near the gate. Field plates (either separate or in conjunction with forming the gate layer) can be used for obtaining high breakdown voltages. In particular, slant field plates can maximize the benefits of the field plates. In some embodiments, a gate insulator is under the gate. The insulator reduces or eliminates the gate leakage current. In embodiments, several surface treatments can increase $n_s$ in Ga-face GaN HEMT structures. Suitable surface treatments include, but are not limited to n-type doping of the material adjacent to the surface, typically the upper 1-5 nm and deposition of certain surface capping layers, such as SiN deposited by CATCVD. In the structures described here, these surface treatments may be used in the access regions to increase $n_s$ in these regions alone. Of course, one or more of the above features can be combined in a single device. For example, a surface capping layer which increases $n_s$ in the access regions may also be used for passivation. In some of the figures, the layers are shown as being directly contacting one another. Although this is not called out as such in the specification, embodiments of the device may require that the layers that are shown next to one another are in direct contact with one another.

A number of embodiments of the invention have been described. Nevertheless, it will be understood that various modifications may be made without departing from the spirit and scope of the invention. Accordingly, other embodiments are within the scope of the following claims.

What is claimed is:

1. A method of forming a III-nitride device, comprising:
forming a layer of GaN on a substrate;
forming a first portion of a layer of AlGaN on the layer of GaN;
depositing a regrowth mask over the gate region of the first portion of the layer of AlGaN;
forming a second portion of the layer of AlGaN in an access region of the device;
forming a gate electrode in a gate region of the device; and
forming a source and a drain outside of the gate region and defining in part the access region; wherein
the device is an enhancement mode device with a threshold voltage greater than 0V.

2. The method of claim 1, further comprising removing the regrowth mask.

3. The method of claim 2, wherein the regrowth mask is one of aluminum nitride, silicon nitride or silicon oxide.

4. The method of claim 1, further comprising doping the second portion of the layer of AlGaN.

5. The method of claim 1, wherein the first portion of the layer of AlGaN is $Al_xGa_{1-x}N$ and the second portion of the layer of AlGaN is $Al_yGa_{1-y}N$, where x≠y.

6. The method of claim 5, wherein x<y.

7. The method of claim 1, wherein a top surface of the gate region has a flatness within 2 nanometers.

8. The method of claim 1, wherein the layer of AlGaN has a uniform composition throughout a thickness of the layer.

9. The method of claim 1, wherein forming the layer of AlGaN controls a thickness of the layer of AlGaN to within 2 nanometers.

10. The method of claim 1, wherein the layer of AlGaN is doped.

11. The method of claim 10, wherein the layer of AlGaN is doped with iron.

12. The method of claim 1, further comprising forming an insulating region between the gate electrode and the layer of AlGaN.

13. The method of claim 1, wherein forming a first portion of a layer of AlGaN includes epitaxially growing AlGaN.

14. The method of claim 1, wherein a two-dimensional electron gas is present in the access region but not in the gate region when 0 gate voltage is applied to the III-nitride device.

15. The method of claim 1, wherein the second portion of the layer of AlGaN includes a surface, further comprising forming a passivation layer over the surface in the access region.

16. The method of claim 15, wherein the passivation layer is a dielectric.

17. The method of claim 15, wherein the passivation layer is SiN.

18. The method of claim 1, wherein the first portion of the layer of AlGaN is made thin enough to ensure that the threshold voltage of the III-nitride device is greater than 0V.

* * * * *